United States Patent [19]

Campbell, III

[11] Patent Number: 4,578,702

[45] Date of Patent: Mar. 25, 1986

[54] CATV TAP-OFF UNIT WITH DETACHABLE DIRECTIONAL COUPLER

[75] Inventor: Wallace S. Campbell, III, Littleton, Colo.

[73] Assignee: American Television & Communications Corporation, Englewood, Calif.

[21] Appl. No.: 615,814

[22] Filed: May 31, 1984

[51] Int. Cl.$^4$ ............... H04N 7/10; H03H 7/48
[52] U.S. Cl. .................... 358/86; 174/59; 333/136
[58] Field of Search ........... 358/84, 86; 455/2, 3, 455/4, 5, 6; 174/59; 333/115, 127, 128, 136

[56] References Cited

U.S. PATENT DOCUMENTS

| | | | |
|---|---|---|---|
| 3,881,160 | 4/1975 | Ross | 333/127 X |
| 3,895,318 | 7/1975 | Ross | 333/136 |
| 4,481,641 | 11/1984 | Gable et al. | 333/128 |
| 4,484,218 | 11/1984 | Boland et al. | 358/84 |

FOREIGN PATENT DOCUMENTS 59-149748  8/1984  Japan .

*Primary Examiner*—Keith E. George
*Attorney, Agent, or Firm*—Laurence S. Rogers; Jeffrey H. Ingerman

[57] ABSTRACT

A tap-off unit or signal transmission device for use in a cable TV system having a plurality of such tap-off units, each tap-off unit receiving cable TV signals from a feeder cable and distributing the signals to a plurality of homes. The tap-off unit has a signal coupler which facilitates removal from the tap-off unit of a circuitry unit and which minimizes the interruption of cable TV signals further down the feeder cable in the event of repair or maintenance of the circuitry unit.

3 Claims, 7 Drawing Figures

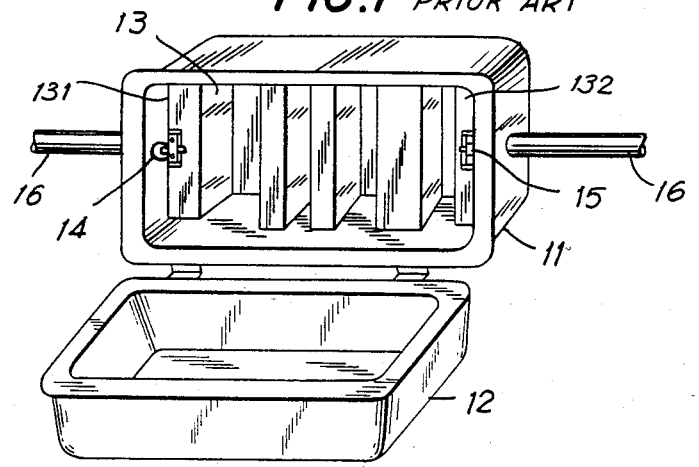
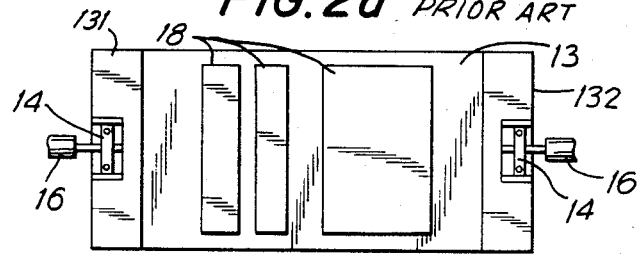
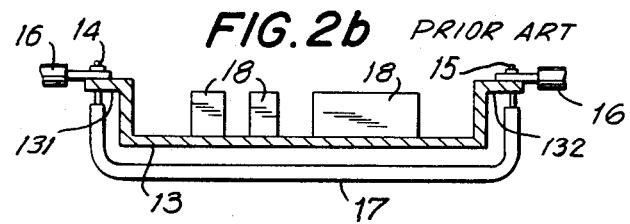

1

CATV TAP-OFF UNIT WITH DETACHABLE DIRECTIONAL COUPLER

BACKGROUND OF THE INVENTION

The present invention relates to an off-premises signal transmission device for distributing cable television ("CATV") signals to a plurality of CATV subscribers.

In a conventional CATV system, CATV signals are transmitted by a CATV cable from a head end to a plurality of subscribers located remotely from the head end. The cable system includes one or more trunk cables extending from the head end, a plurality of feeder cables branched from the trunk cable, and a plurality of drop cables branched from the feeder cables for delivering the CATV signal to subscriber homes. Each subscriber has one or more in-home CATV converter/tuners connected to the drop cable entering the subscriber's home. The CATV converter/tuner enables the subscriber to select one of a plurality of CATV signals (channels) available on the drop cable. The CATV service company enables the in-home CATV converter to allow the subscriber to view those TV channels to which he or she has subscribed.

There are at least two problems associated with the above-described conventional CATV system. First, the subscriber has access to the in-home converter and may modify that device to receive TV channels for which he has not subscribed, thus resulting in a loss of revenue to the CATV service company. Second, the subscriber may remove the expensive CATV converter, e.g., in the event that the subscriber moves. Again, the CATV company incurs a loss.

To solve these problems, it is possible to design a CATV system in which the expensive converter/tuner and other electronic circuitry is located in an external control unit or signal transmission device attached to and in series with a feeder cable. The external control units are typically mounted outdoors, e.g., on or adjacent to utility poles. Each external control unit includes a plurality of converter/tuners for providing cable TV signals to a plurality of subscribers via drop cables connecting the external control unit to each subscriber's house. Each subscriber has a subscriber processing unit which can communicate with the external control unit via the drop cable to allow the subscriber, using keys on the subscriber processing unit, to request a TV channel for viewing.

A requirement for a CATV system having external control units as above-described is to improve maintenance efficiency and to minimize as much as possible the disruption of cable TV service to subscribers in the event of the need to repair an external control unit. It is known that signal transmission devices connected in series with a CATV cable, such as tap-off devices, can be arranged as shown in FIG. 1. Reference numeral 11 is a box-like main housing. Cover 12 is supported on main housing 11 such that the cover can be freely opened and closed with respect to the main housing. A recessed chassis 13 is disposed in main housing 11. Collars 131 and 132, respectively having input and output connecting terminals 14 and 15, are formed at two ends of chassis 13. Input and output connecting terminals 14 and 15 are connected to feeder cable 16 to which a plurality of other tap-off devices are connected at various locations along the cable. Input and output connecting terminals 14 and 15 are coupled to each other through a connecting cable 17 disposed along the rear surface of chassis 13, as shown in FIGS. 2(a) and 2(b). Internal electronic units 18 connected to input connecting terminal 14 are arranged on chassis 13.

In signal transmission devices having the configuration described above, when one of internal units 18 (FIGS. 2(a) and 2(b)) is broken or must be replaced with a new one, repair or replacement can only be performed after feeder cable 16 is removed, since not only internal units 18 but also input and output connecting terminals 14 and 15 are mounted on chassis 13. In such a case, CATV signals cannot appear at the output feeder cable 16, and thus CATV signals cannot be further transmitted along the feeder cable to subsequent subscribers down the line.

In order to solve the above problem, the input feeder cable 16 must be connected to output feeder cable 16 through a short-circuiting pin or wire (not shown) at the time of repair or replacement of the defective internal unit 18. This results in a time-consuming and cumbersome operation. The present invention has been made in consideration of the above situation, and has for its object to provide a signal transmission device which allows maintenance and repair procedures to be performed on CATV external control units while minimally disrupting the transmission of CATV signals to subscribers further down the cable.

SUMMARY OF THE INVENTION

In order to achieve the above object in accordance with the present invention, there is provided a CATV signal transmission device connected in series between a first feeder cable portion and a second feeder cable portion and including a main housing having an input terminal and an output terminal for respectively connecting the main housing to the first and second feeder cable portions, a support member detachably mounted in the main housing and having electronic circuitry mounted thereon, and a coupling member for electrically connecting the first feeder cable portion, the second feeder cable portion, and the electronic circuitry when the support member is mounted in the housing, and for electrically connecting the first feeder cable portion and the second feeder cable portion when the support member is not mounted in said housing.

BRIEF DESCRIPTION OF THE DRAWINGS

FIG. 1 is a perspective view illustrating a conventional signal transmission device;

FIGS. 2(a) and 2(b) are a plan view and a sectional view, respectively, of the device shown in FIG. 1;

DETAILED DESCRIPTION OF THE PREFERRED EMBODIMENT

A signal transmission device according to an embodiment of the present invention will be described with reference to the accompanying drawings.

Figure 3:
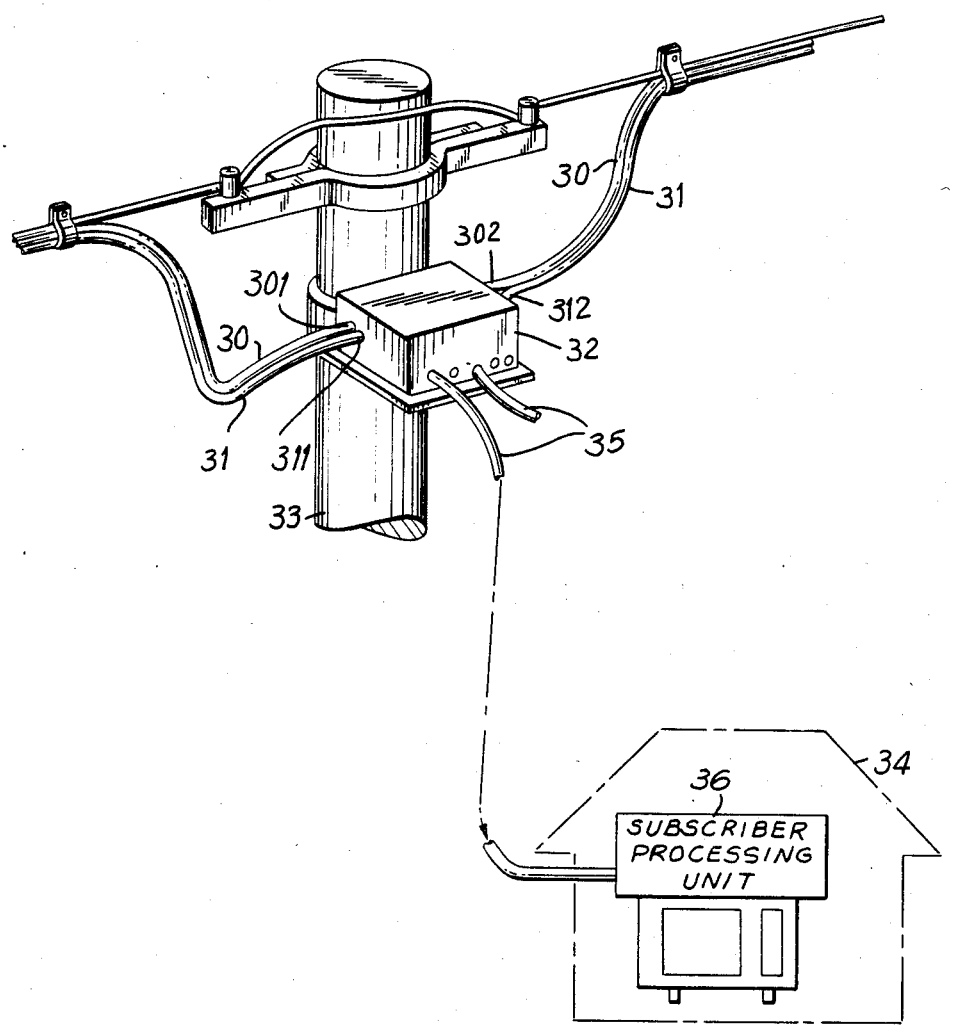
FIG. 3 is an illustration of part of a CATV system for which the present invention has application.

Referring first to FIG. 3, reference numerals 30 and 31 denote two CATV feeder cables branched from trunk cables (not shown) connected to a head end. Signal transmission device 32 is mounted on or adjacent to utility pole 33 and connected to feeder cables 30 and 31. Drop cables 35 are connected between signal transmission device 32 and one or more subscriber houses 34. Only one subscriber house is shown in FIG. 3 for illustrative convenience. However, in one embodiment, as many as six drop cables can be connected between signal transmission device 32 and as many as six subscriber houses.

A subscriber processing unit 36 for communicating with signal transmission device 32 to enable a subscriber to select a TV channel for viewing is installed as an indoor unit in each subscriber house 34. Signal transmission device 32 is connected in series with feeder cables 30 and 31 by connecting the feeder cables to input terminals 301 and 311, respectively, of the signal transmission device and to output terminals 302 and 312 thereof, respectively. Feeder cables 30 and 31 are subsequently connected to other signal transmission devices (not shown) in like manner.

Although two feeder cables are shown in FIG. 3 connected to signal transmission device 32, it should be understood that second feeder cable 31 is provided for system expansion (e.g., to carry additional CATV channels), and is not required to practice the present invention.

Figure 4:
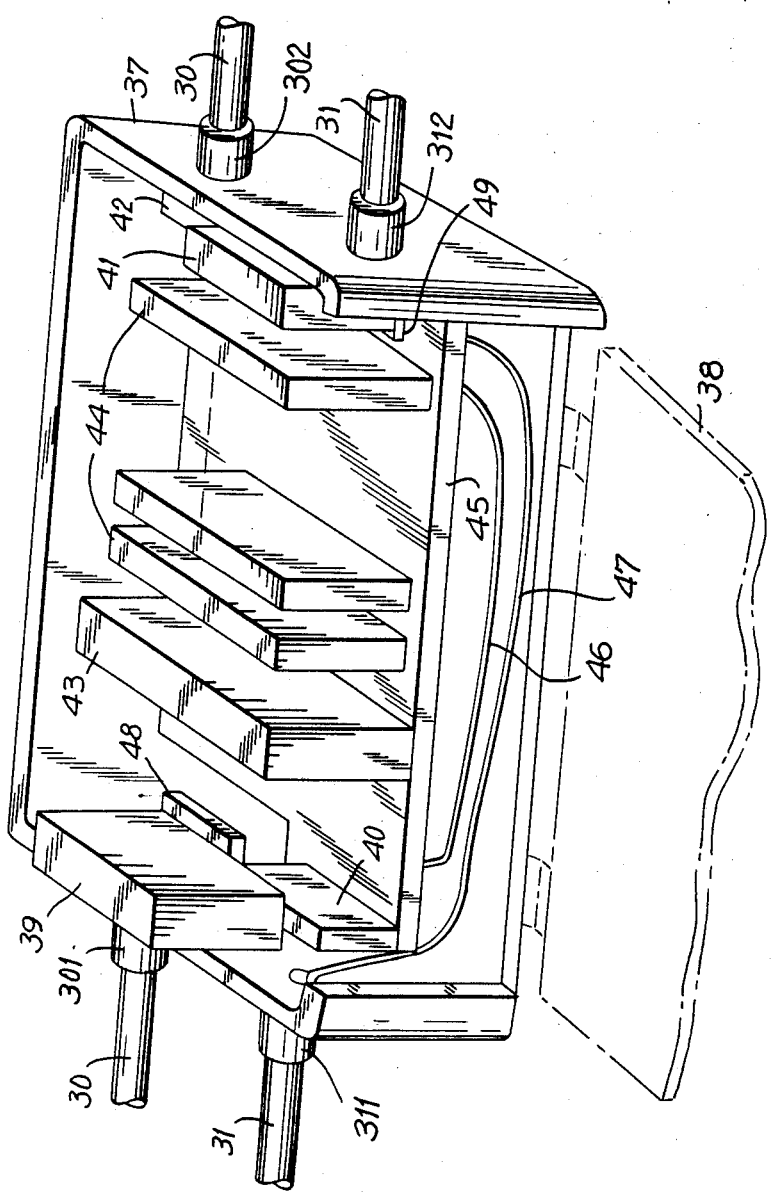
FIG. 4 is a perspective view illustrating a signal transmission device according to an embodiment of the present invention.

FIG. 4 shows the detailed construction of signal transmission device 32. A hinged cover 38 is mounted on a box-like main housing 37 such that cover 38 can be freely opened or closed with respect to the main housing. Feeder cables 30 and 31 are connected to input terminals 301 and 311 of main housing 37 and to output terminals 302 and 312 thereof. A first conventional directional coupler 39 and a first conventional distributor 40, each associated with feeder cable 30, are located at one end of main housing 37. Similarly, a second conventional directional coupler 41 and a second conventional distributor 42, each associated with feeder cable 31, are located at the other end of main housing 37. Chassis 45 is detachably mounted in main housing 37. Chassis 45 includes a plurality of detachably mounted electronic circuit modules, including common control unit 43 and a plurality of subscriber units 44. The detachable mounting of the electronic circuit modules to the chassis may be accomplished, for example, by the use of conventional electrical plugs and sockets. Distributors 40 and 42 are mounted on chassis 45. Two terminal blocks 48 and 49 are mounted to main housing 37. Directional couplers 39 and 41 are respectively detachably connected to and mounted on terminal blocks 48 and 49 and distributors 40 and 42. Feeder cables 30 and 31 are respectively connected to connecting cables 46 and 47 at both ends of main housing 37 in a manner to be described below.

Figure 5:
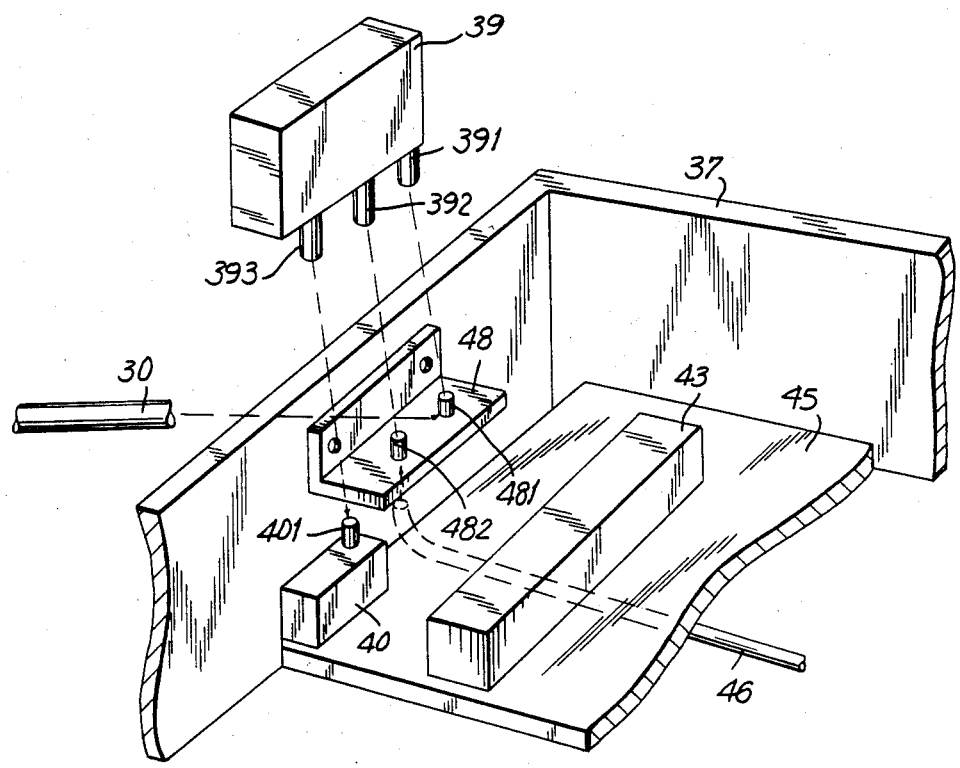
FIG. 5 is a perspective view illustrating a detailed structure of the device shown in FIG. 4.

FIG. 5 shows feeder cable 30 at one end of main housing 37. The input side of the feeder cable 30 is electrically connected to a first terminal 481 of terminal block 48. A second terminal 482 of terminal block 48 is electrically connected to one end of cable 46. The other end of connecting cable 46 is connected to the output side of feeder cable 30 at the output end of main housing 37. First directional coupler 39 is detachably mounted on terminal block 48 by means of plugs 391 and 392 engaging terminal 481 and 482 of terminal block 48. First directional coupler 39 electrically couples connecting plugs 391, 392, and 393 thereof to the first and second terminals 481 and 482 of terminal block 48, and to first distributor 40, respectively.

Feeder cable 31 is arranged with respect to terminal block 49 (shown in FIG. 4) at the output side of main housing 37 in the same manner as feeder cable 30 is arranged at the input side thereof. Accordingly, a detailed illustration and description of the second connecting arrangement with respect to feeder cable 31 is not shown.

In the case of removing chassis 45 from main housing 37 so as to perform maintenance or repair of the electronic circuitry mounted on chassis 45, the first and second directional couplers 39 and 41 are removed from terminal blocks 48 and 49, respectively, and chassis 45 is removed from main housing 37. This causes the interruption of CATV service to subscribers further down the line. However, this interruption of service is eliminated by remounting first and second directional couplers 39 and 41 on first and second terminal blocks 48 and 49, respectively. By remounting directional couplers 39 and 41, the inputs and outputs of feeder cables 30 and 31 are respectively electrically connected through directional couplers 39 and 40 and cables 46 and 47, respectively. Subsequently, signals continue to be transmitted further along feeder cables 30 and 31, respectively.

Figure 6:
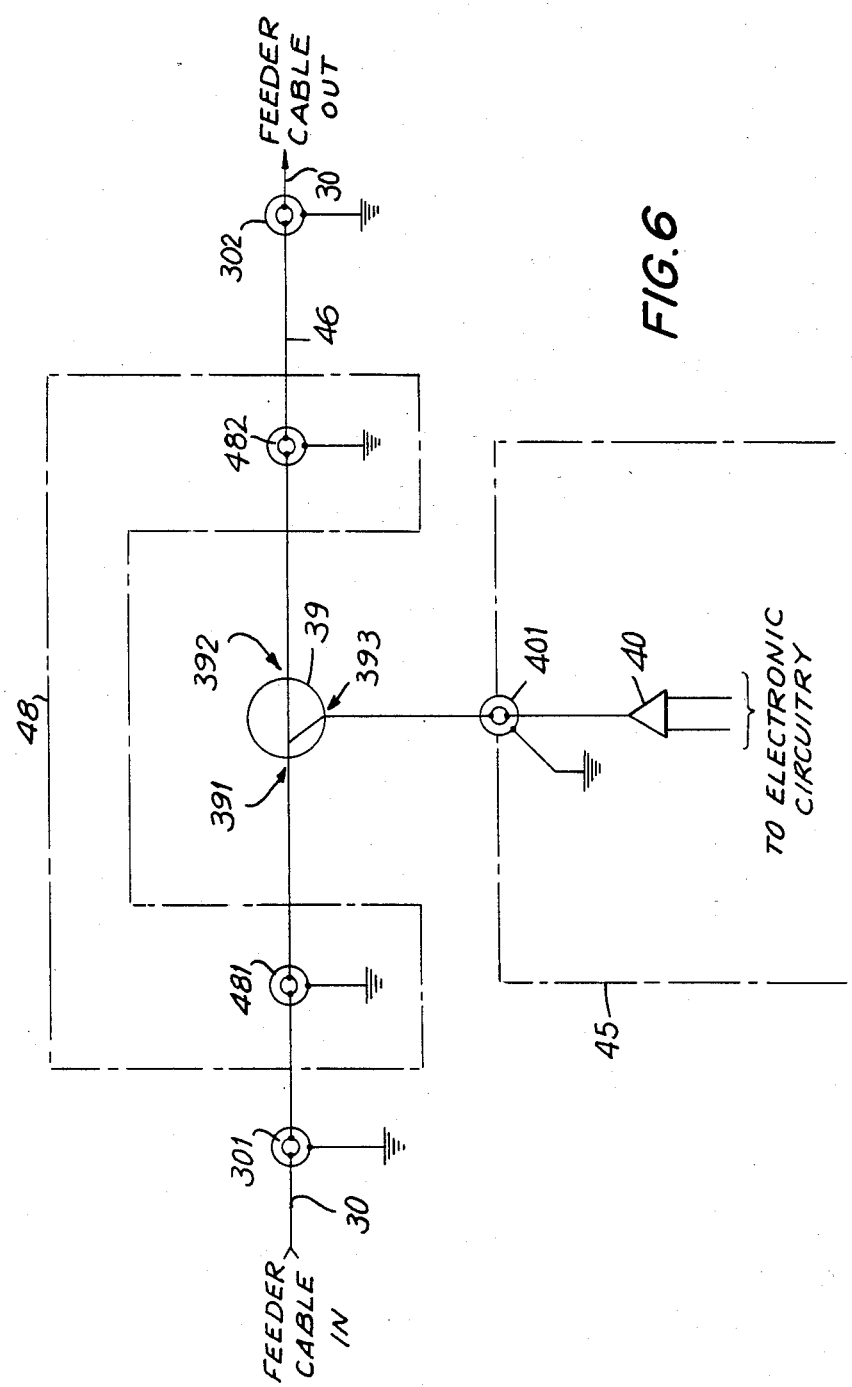
FIG. 6 is a circuit diagram of a portion of the device shown in FIGS. 4 and 5.

FIG. 6 shows a diagram of the electronic circuitry of the coupler of the invention. The circuitry for only feeder cable 30 is shown. The circuitry for feeder cable 31 is identical.

Referring to FIG. 6, detachable directional coupler 39 is shown having three plugs 391, 392, and 393. Plugs 391 and 392 connect to terminals 481 and 482 mounted on terminal block 48, and plug 393 connects to terminal 401 of distributor 40 mounted on chassis 45. Feeder cable 30 carrying cable TV signals from a head end is attached to terminal 301. Cable TV signals enter directional coupler 391 via terminals 301 and 481. Directional coupler 39, the internal circuitry of which is conventional, passes these signals to conventional distributor 40 via plug 393 and terminal 401 for use by the electronic circuitry of the signal transmission device. Also, directional coupler 39 passes TV signals from plug 391 to terminal 302 via plug 392, terminal 482, and connecting cable 46. Feeder cable 30 connects to terminal 302 to carry cable TV signals to other signal transmission devices further down the cable.

In the event that chassis 45 must be removed from main housing 37 for repair or maintenance, directional coupler 39 is unplugged from terminals 401, 481 and 482, thus breaking the connection between terminals 401, 481, and 482. However, once chassis 45 has been removed, directional coupler 39 can immediately be plugged back into terminals 481 and 482 to re-establish a connection between terminals 301 and 302. Separate jumper wires or other devices are not required to maintain a continuous transmission of signals to other signal transmission devices and other subscribers, located further down the cable. Accordingly, maintenance and repair procedures can be performed on the signal transmission devices while minimally disrupting service to subscribers further down the cable.

While a preferred embodiment of the invention has been set forth for purposes of the disclosure, modification to the preferred embodiment may occur to those skilled in the art. Accordingly, the appended claims are intended to cover all embodiments of the invention and modifications to the disclosed embodiment which do not depart from the spirit and scope of the invention.

What is claimed is:

1. A signal transmission device for use in a cable television system, said device connected in series between a first CATV feeder cable portion and a second CATV feeder cable portion, said device comprising:
    a main housing having an input terminal for attachment to the CATV feeder cable portion and an output terminal for attachment to the second CATV feeder cable portion;
    a connecting cable attached to the output terminal of said main housing for supplying signals received at the input terminal of said main housing to the output terminal of said main housing;
    a chassis detachably mounted in said housing, said chassis having electronic circuitry mounted thereon; and
    an at least partially detachable directional signal coupler for directionally electrically connecting said electronic circuitry, said input terminal, and said connecting cable when said chassis is mounted in said main housing, and for electrically connecting said input terminal and said connecting cable when said chassis is removed from said main housing.

2. The signal transmission device of claim 1, wherein said directional signal coupler includes a portion which is fixed to said chassis and a portion which is detachable from said fixed portion.

3. The signal transmision device of claim 1, wherein said detachable portion is a directional coupler.

* * * * *